United States Patent
Terada et al.

(10) Patent No.: US 9,858,035 B2
(45) Date of Patent: Jan. 2, 2018

(54) SIGNAL PROCESSING DEVICE AND STORAGE MEDIUM

(71) Applicant: Yamaha Corporation, Hamamatsu-shi, Shizuoka-ken (JP)

(72) Inventors: Kotaro Terada, Hamamatsu (JP); Shunichi Kamiya, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 0 days.

(21) Appl. No.: 14/660,788

(22) Filed: Mar. 17, 2015

(65) Prior Publication Data

US 2015/0268923 A1 Sep. 24, 2015

(30) Foreign Application Priority Data

Mar. 24, 2014 (JP) ................................. 2014-060924

(51) Int. Cl.
*H03G 3/00* (2006.01)
*G06F 3/16* (2006.01)
*H03G 3/02* (2006.01)
*H03G 7/00* (2006.01)
*H04H 60/04* (2008.01)

(52) U.S. Cl.
CPC ............... *G06F 3/165* (2013.01); *H03G 3/02* (2013.01); *H03G 7/002* (2013.01); *H04H 60/04* (2013.01)

(58) Field of Classification Search
CPC ........... H03G 3/02; H03G 7/002; H04H 60/04
See application file for complete search history.

(56) References Cited

U.S. PATENT DOCUMENTS

| 2005/0226595 A1* | 10/2005 | Kreifeldt ................ H04H 60/04 386/231 |
| 2005/0232444 A1 | 10/2005 | Arakawa |
| 2007/0061729 A1* | 3/2007 | Terada ................... H04H 60/04 715/727 |

(Continued)

FOREIGN PATENT DOCUMENTS

| EP | 0 987 896 A2 | 3/2000 |
| EP | 1 580 910 A2 | 9/2005 |

OTHER PUBLICATIONS

Yamaha. (2005). Digital Mixing Console M7CL, Owner's Manual, English translation, total of 282 pages, submit in two parts.

(Continued)

*Primary Examiner* — Regina N Holder
(74) *Attorney, Agent, or Firm* — Morrison & Foerster LLP

(57) ABSTRACT

In each category representing a signal type, a recommended minimum value and a recommended maximum value of a level of a signal are stored. The recommended minimum value and the recommended maximum value are determined based on a dynamic range of the signal of the type, for example. A function configured to set a gain used for adjusting a level of an input signal according to a user operation, and a function configured to set a category are provided. Further, a meter portion configured to display the level of the signal level-adjusted by the set gain is provided, and the recommended minimum value and the recommended maximum value of the set category are exhibited in a manner to correspond to the display by the meter portion.

10 Claims, 7 Drawing Sheets

(56) References Cited

U.S. PATENT DOCUMENTS

2010/0199204 A1* 8/2010 Oh .................. G10L 19/008
                                                    715/771

OTHER PUBLICATIONS

Yamaha. (2005). Digital Mixing Console M7CL, Owner's Manual, Japanese language, total of 282 pages, submit in two parts.
European Search Report dated Oct. 6, 2015, for EP Application No. 15160450.1, five pages.

* cited by examiner

{Fig. 1}
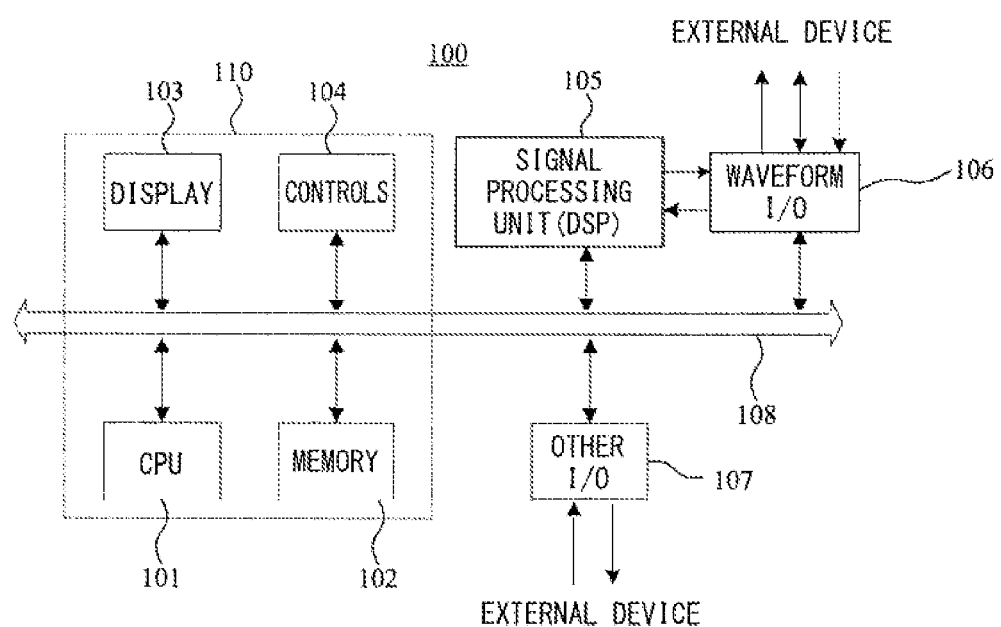

{Fig. 2A}
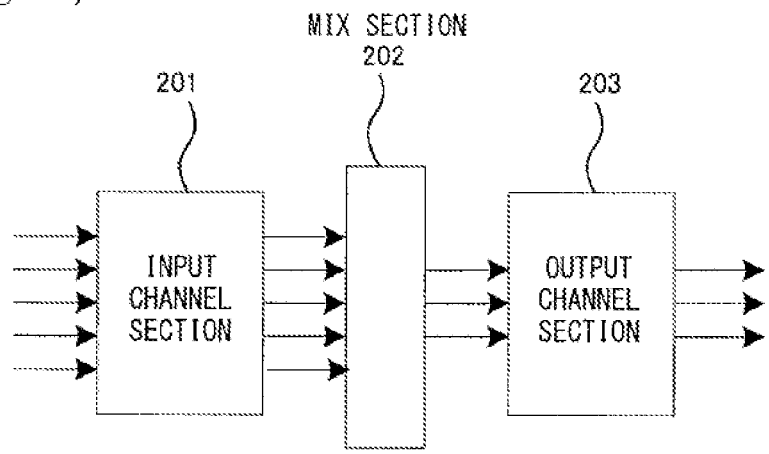
{Fig. 2B}
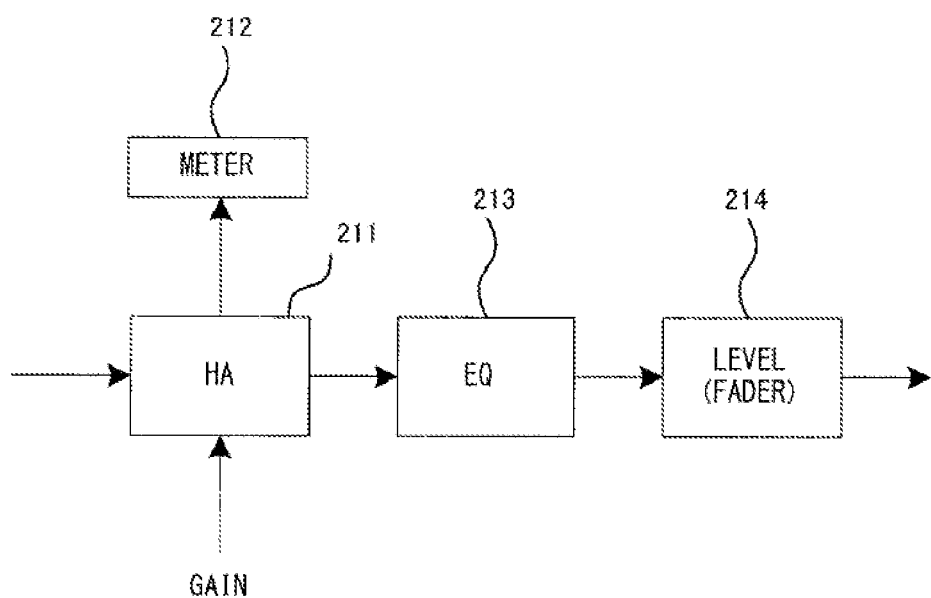

{Fig. 3}
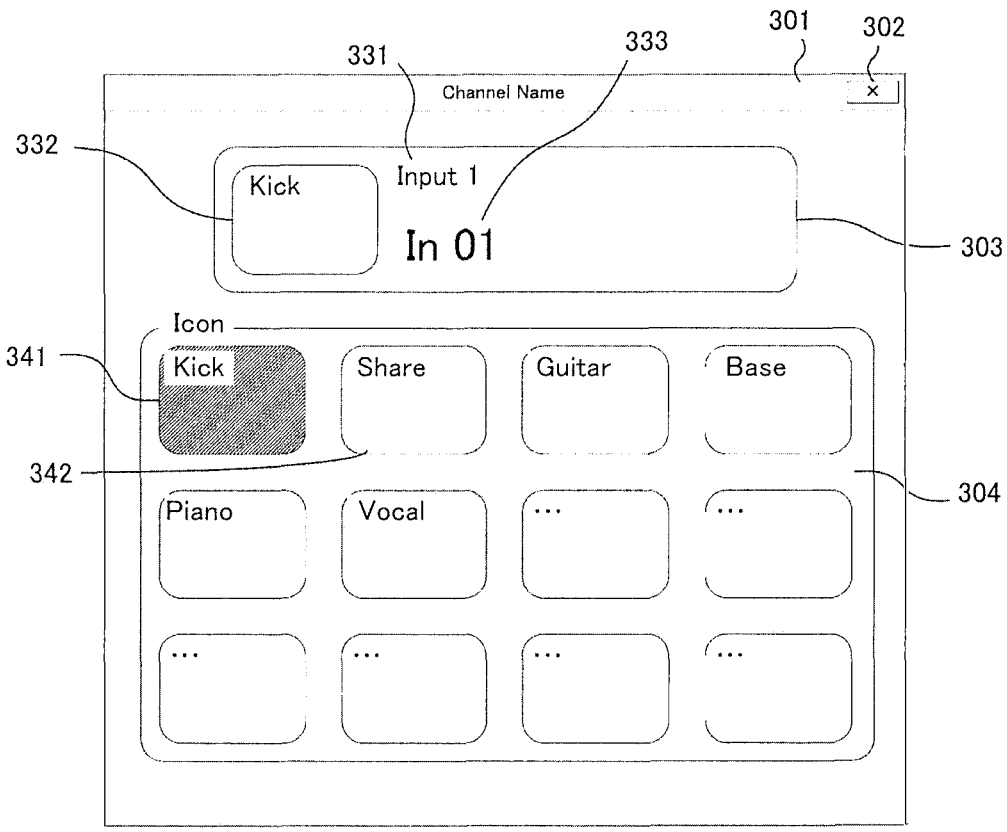
{Fig. 4}
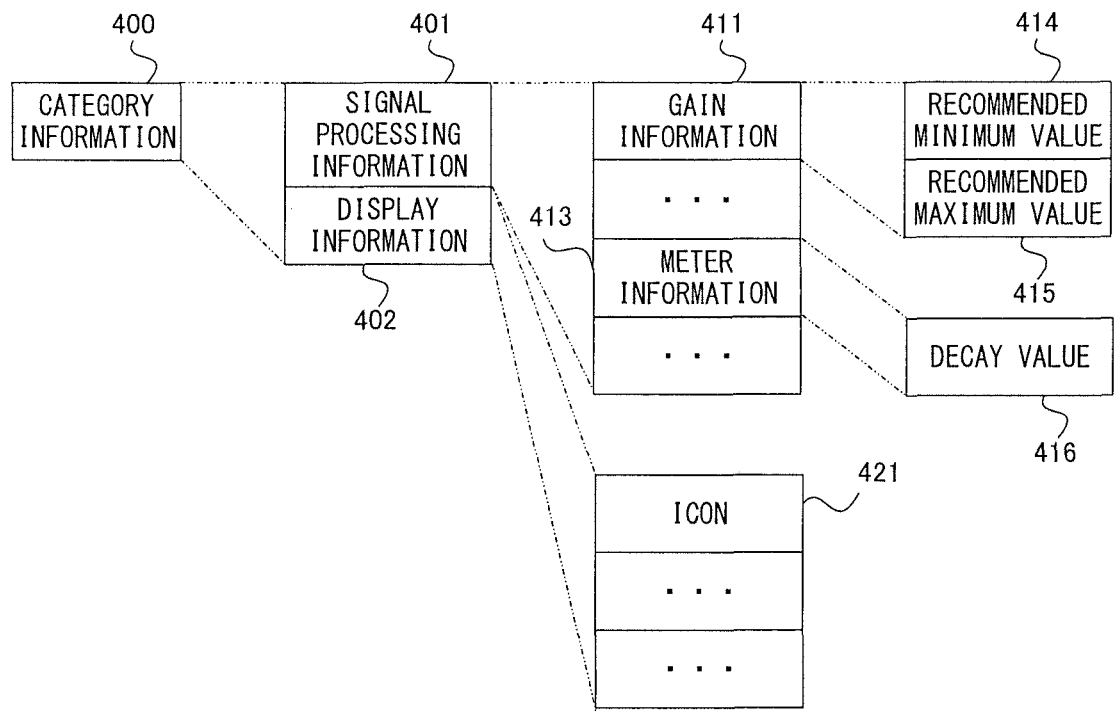

{Fig. 5}
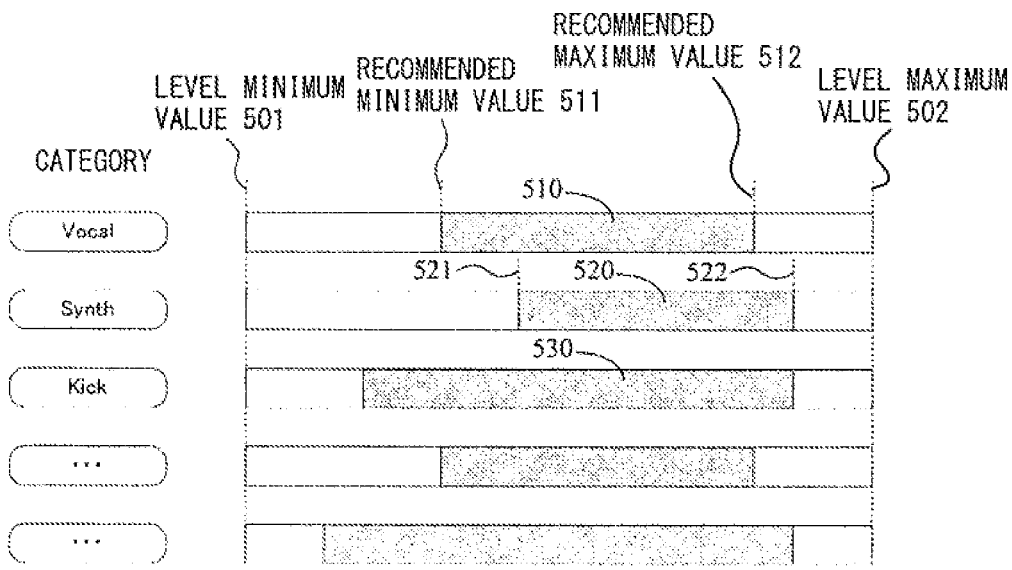
{Fig. 6}
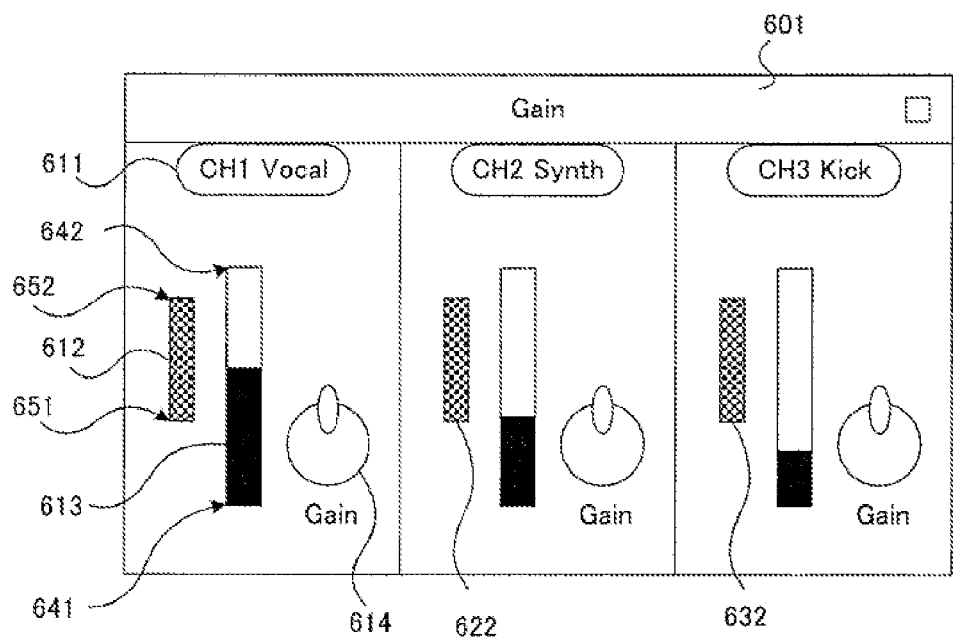

{Fig. 7}
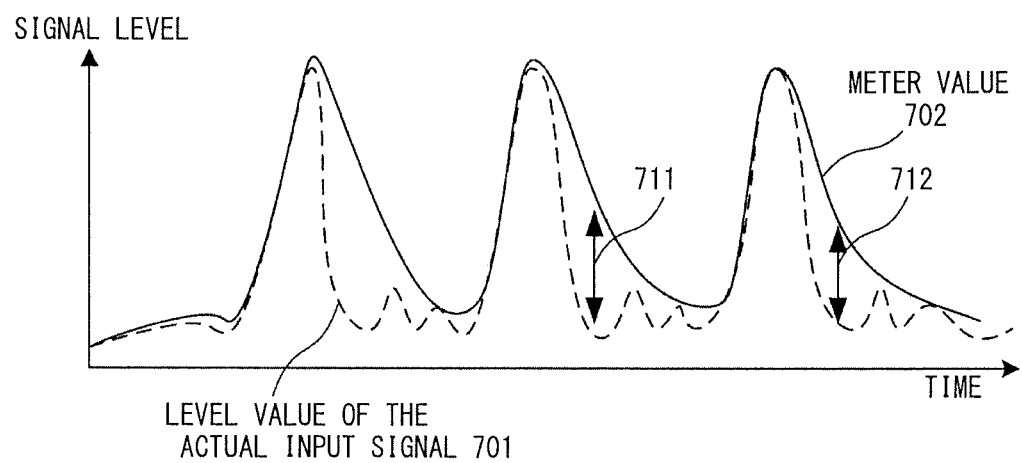

{Fig. 8}
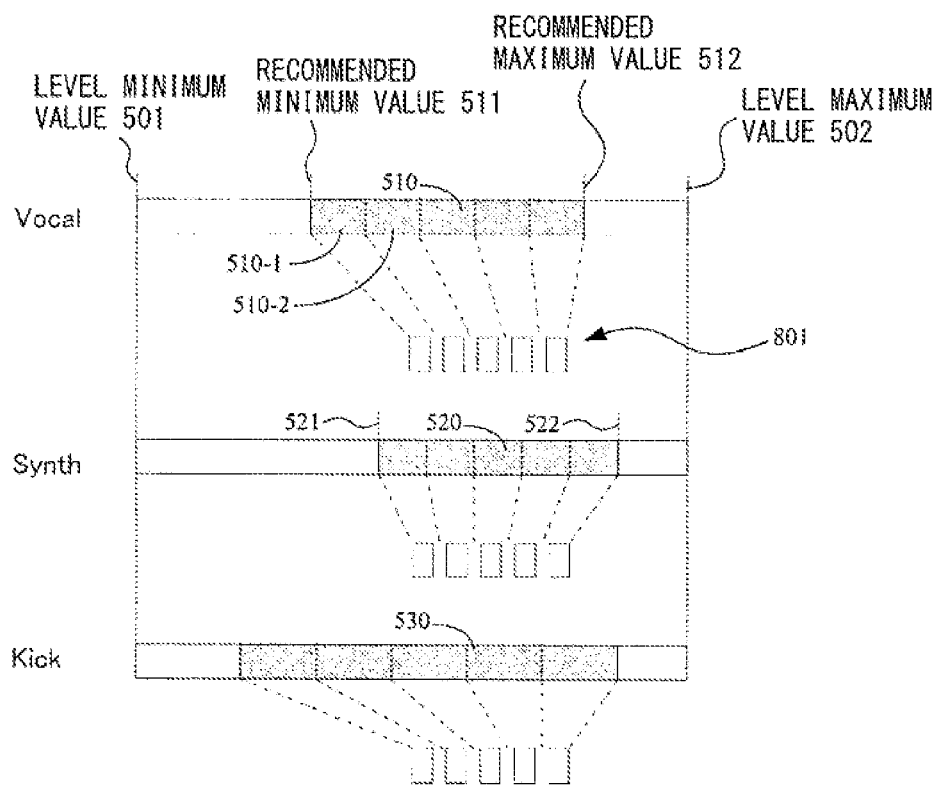
{Fig. 9}
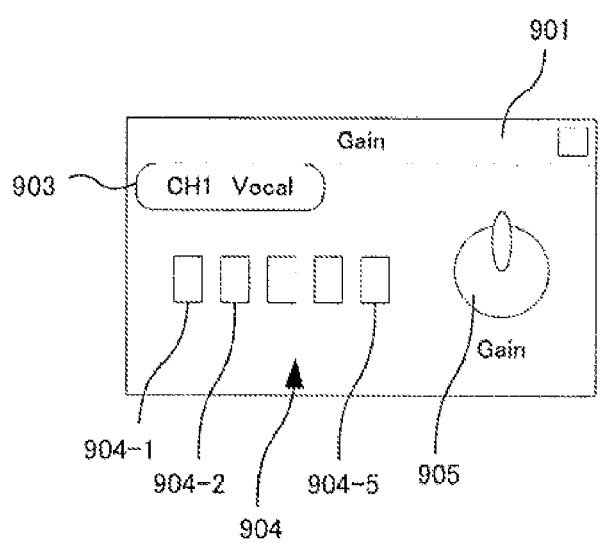

{Fig. 10}
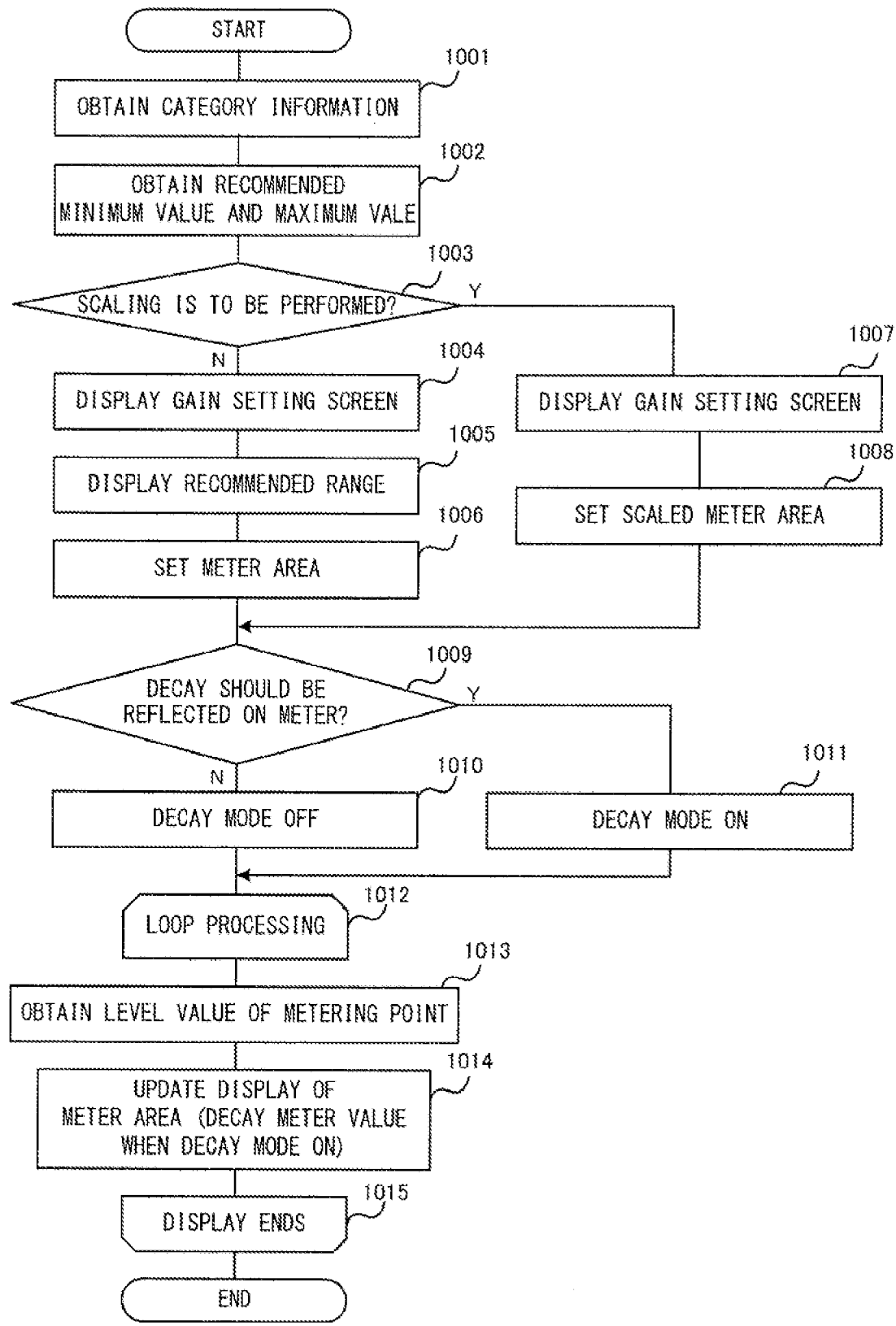

SIGNAL PROCESSING DEVICE AND STORAGE MEDIUM

TECHNICAL FIELD

The invention relates to a signal processing device capable of performing gain adjustment of a signal properly and easily, and a non-transitory machine-readable storage medium containing program instructions for enabling a computer to realize the gain adjustment.

BACKGROUND ART

There have been conventionally known various signal processing devices to perform signal processing on an inputted signal. For example, there is an audio signal processing device such as a mixer that inputs an audio signal and performs various processes such as mixing on the inputted signal to output the processed signal. With regard to such a signal processing device, there is one provided with a function in which at an input stage of a signal, gain control is performed and thereby the level of the signal is adjusted to fall within a range proper for performing signal processing. In the mixer, a head amplifier is provided at an input stage of an input channel (ch) for processing an audio signal (see the description of a head amplifier in NPL1). The head amplifier is an amplifier for adjusting a level of an input signal to fall within a range proper for performing signal processing (for example, an equalizer, a compressor, or the like) in an input channel. A user of the mixer adjusts the gain to be a possible higher level in a range where a level indicated by a meter does not become OVER.

CITATION LIST

{Non Patent Literature}
{NPL1} DIGITAL MIXING CONSOLE M7CL, User's manual, 2005, Yamaha Corporation

SUMMARY OF INVENTION

Technical Problem

There is often a case that it is difficult for a beginner to perform the above-described gain adjustment in the head amplifier. For example, musical sound of a hit sound group and musical sound of a sustained tone group are different in proper level of a gain, and an experienced user recognizes it empirically, but for a beginner, it is often unclear.

The present invention has an object to provide a signal processing device that enables even a beginner to perform gain adjustment of a signal properly and easily.

Solution to Problem

To attain the above object, a signal processing device of the invention is a signal processing device, including: a range information storing portion configured to store a range with respect to a level of a signal for each category representing a signal type; a gain setting portion configured to set a gain used for adjusting a level of an input signal according to an operation by a user; a category setting portion configured to set the category; a meter portion configured to display a level of the input signal after a level adjustment according to the gain; and a portion configured to exhibit the range for the category set by the category setting portion in a manner to correspond to the display of the level by the meter portion.

Another signal processing device of the invention is a signal processing device, including: a range information storing portion configured to store a minimum value and a maximum value with respect to a level of a signal for each category representing a signal type; a gain setting portion configured to set a gain used for adjusting a level of an input signal according to an operation by a user; a category setting portion configured to set the category; a meter portion configured to display a level of the input signal after a level adjustment according to the gain; and a portion configured to adjust the display of the level by the meter portion such that a lower limit of the display of the level corresponds to the minimum value for the category set by the category setting portion, and an upper limit of the display of the level corresponds to the maximum value for the category set by the category setting portion.

In the above signal processing devices, it is conceivable that the meter portion receives the input signal after the level adjustment, decreases a change rate of decay of the received signal to generate a meter value which changes gradually, and displays the meter value as the level of the input signal.

A storage medium according to the invention is a non-transitory machine-readable storage medium containing program instructions executable by a computer and enabling the computer to function as a signal processing device including: a range information storing portion configured to store a range with respect to a level of a signal for each category representing a signal type; a gain setting portion configured to set a gain used for adjusting a level of an input signal according to an operation by a user; a category setting portion configured to set the category; a meter portion configured to display a level of the input signal after a level adjustment according to the gain; and a portion configured to exhibit the range for the category set by the category setting portion in a manner to correspond to the display of the level by the meter portion.

Another storage medium according to the invention is a non-transitory machine-readable storage medium containing program instructions executable by a computer and enabling the computer to function as a signal processing device including: a range information storing portion configured to store a minimum value and a maximum value with respect to a level of a signal for each category representing a signal type; a gain setting portion configured to set a gain used for adjusting a level of an input signal according to an operation by a user; a category setting portion configured to set the category; a meter portion configured to display a level of the input signal after a level adjustment according to the gain; and a portion configured to adjust the display of the level by the meter portion such that a lower limit of the display of the level corresponds to the minimum value for the category set by the category setting portion, and an upper limit of the display of the level corresponds to the maximum value for the category set by the category setting portion.

Advantageous Effects of Invention

According to the present invention, even a beginner can set and adjust an appropriate gain easily without considering a range of a dynamic range different in each category (for example, musical instrument type, or the like).

BRIEF DESCRIPTION OF DRAWINGS

FIG. 1 is a diagram of a hardware structure of a digital mixer of an embodiment.

FIG. 2A is a view illustrating a functional constitution example of mixing processing of the digital mixer of the embodiment.

FIG. 2B is a view illustrating a functional constitution example of an input channel of the digital mixer of the embodiment.

FIG. 3 is a view illustrating an example of a channel name setting screen.

FIG. 4 is a view illustrating a constitution of category information.

FIG. 5 is a view illustrating a recommended range of a level in each category.

FIG. 6 is a view illustrating a first example of a gain setting screen.

FIG. 7 is a view illustrating a display image of a meter.

FIG. 8 is a view illustrating an example where only a recommended range of a level in each category is scaled to be meter-displayed.

FIG. 9 is a view illustrating a second example of the gain setting screen.

FIG. 10 is a flowchart of gain setting processing.

DESCRIPTION OF EMBODIMENTS

Hereinafter, there will be explained an embodiment of the present invention by using the drawings.

FIG. 1 is a block diagram illustrating a hardware structure of a mixer 100 to which a signal processing device of one embodiment of the present invention is applied. A CPU 101 is a processing device to control the entire operation of the mixer. A memory 102 is a storage device in which various programs for processes executed by the CPU 101 and explained by using a later-described flowchart, and the like, various data exemplified in the following explanation, and the like are stored, and is constituted by appropriately combining storage devices such as a RAM, a ROM, a flash memory, and a hard disk. A display 103 is a display provided on a control panel of the mixer 100 and used for displaying various information thereon. The display 103 is a touch panel in this embodiment and can detect touch controls. Controls 104 include various controls (moving faders, rotary encoders, switches, buttons, and the like) for a user to operate, which are provided on the control panel of the mixer 100. A signal processing unit 105 is, for example, a DSP (a digital signal processing device) and executes various signal processing programs based on instructions by the CPU 101, to thereby perform a mixing process, an effect adding process, and a volume level control process, and the like on audio signals inputted via a waveform I/O 106, and outputs the processed audio signals via the waveform I/O 106. An other I/O 107 is an interface used for connecting to various external devices such as a PC, for example. A bus 108 is a bus line connecting these portions, and is a general name referring to a control bus, a data bus, and an address bus 110 denotes a component to fabricate the signal processing device according to the present invention.

FIG. 2A is a block diagram illustrating a functional constitution of mixing processing achieved by the mixer in this embodiment. An analog audio signal inputted from various audio signal supply sources such as a microphone is converted into a digital audio signal in a not-illustrated input port and is inputted to one of plural input channels in an input channel section 201 according to specification of the user. The input channels of the input channel section 201 each perform a characteristic adjustment process with regard to amplitude characteristic, frequency characteristic, and the like on the inputted audio signal based on an instruction by the CPU 101. Audio signals outputted from these input channels are mixed in a MIX section 202 according to an instruction by the CPU 101, and the mixed signal is outputted to one of plural output channels in an output channel section 203. Audio signals outputted from these output channels are converted into analog signals to be outputted in not-illustrated output ports. These blocks 201 to 203 are realized by the signal processing unit 105 to execute signal processing programs set by the CPU 101 and the CPU 101 to control the signal processing unit 105. Incidentally, the input and output of the analog audio signal has been explained as an example here, but input and output of a digital audio signal may also be applied.

FIG. 2B is a block diagram illustrating a schematic constitution of a single input channel in the input channel section 201. A head amplifier (HA) 211 is a preamplifier to adjust a sound volume level of an audio signal inputted to the input channel according to a given gain value (GAIN). A meter 212 is a meter to display a level of the inputted audio signal level-adjusted in the HA 211. The user can adjust the gain value to be given to the HA 211 by a predetermined control while viewing the meter 212. Particularly, this embodiment is provided with a mechanism enabling the user to easily adjust the gain value to an appropriate value, and this mechanism will be described later. An equalizer (EQ) 213 is a module to perform adjustment of frequency characteristic. A level (Level) 214 is a level adjusting unit to adjust a transmission level of a signal. Incidentally, the constitution of the input channel illustrated here is one example, and additionally, a high-pass filter, a gate, a compressor, a delay, a pan, and modules to perform other various processes on an audio signal may also be provided.

FIG. 3 illustrates an example of a channel name setting screen of the mixer in this embodiment. When a single channel is specified and a predetermined operation to give an instruction of channel name setting is performed on a predetermined screen, the mixer 100 displays a channel name setting screen 301. 302 denotes a close button, 303 denotes an icon and name display area, and 304 denotes a candidate icon display area. In the icon and name display area 303, a channel number display 331 of a channel to be subjected to a channel name setting process, a selected icon display 332, and a channel name setting area 333 are provided. In the candidate icon display area 304, plural icons 341, 342, . . . being selectable candidates are displayed.

The icons 341, 342, . . . in the candidate icon display area 304 each indicate one category and roughly represent a concept of a musical instrument type or the like. For example, "Kick" of the icon 341 is a category representing musical instruments of a bass drum group, and "Snare" of the icon 342 indicates a category representing musical instruments of a snare drum group. Incidentally, the icons are each illustrated in a rectangle and in a character string such as "Kick" here, but designs corresponding to the categories may also be displayed practically. The user can touch and select one of these icons 341, 342 . . . , and specific a rough concept of a musical instrument type of a signal to be processed in the channel being a target of the channel name setting process. FIG. 3 illustrates the screen of a state where the user touches the icon 341 to select "Kick" as a category. Oblique lines of the icon 341 indicate that this icon is selected. The selected icon is displayed on the selected icon display 332 in the icon and name display area 303. Incidentally, the categories in the present invention indicate ones in which inputted signals are classified into groups according to various aspects of characteristic, condition, environment, and the like. For example, the categories are a musical instrument type (type, name, and the like of percussion musical instruments, stringed musical instruments, and the like), a voice type (male voice, female voice, and the like), a range (soprano, alto, and the like), a name and a band name of performers or a performance environment of halls, studios, and the like, and a genre of performances (plays, rock, pop, and the like).

As above, the user can set a category to the specified channel by using the channel name setting screen 301. Such a function of setting a category (and a channel name) to each channel has been provided also in conventional mixers, but this function has been used merely to help a user easily understand a setting condition and an operation condition of each channel by displaying a category and a channel name with the setting condition and the operation condition of each channel. In contrast to this, in the mixer in this embodiment, information useful for gain setting is provided in each category and a category is set to a channel, thereby making it possible to exhibit useful information to the user on the occasion of performing gain setting in the HA 211 of the channel.

FIG. 4 illustrates a constitution example of category information provided in the memory 102 of the mixer in this embodiment. The category information is provided for every plural categories. A piece of category information 400 includes signal processing information 401 and display information 402. The display information 402 includes icon information 421 being image data of an icon representing the category, and the like. The display information 402 may also include various data regarding display in addition to the icon information 421.

The signal processing information 401 is provided with gain information 411, meter information 413, and the like. A decay (Decay) value 416 of the meter information 413 will be described later with reference to FIG. 7. The category information may also include various information such as, for example, setting information of the EQ to be recommended for the category in addition to the above described information.

The gain information 411 includes a recommended minimum value 414 and a recommended maximum value 415 in the category. As described above, the category roughly indicates a musical instrument type or the like, and the recommended minimum value 414 indicates the minimum value of a dynamic range according to the musical instrument type of the category, and the recommended maximum value 415 indicates the maximum value of the dynamic range according to the musical instrument type of the category. For example, with regard to musical sound signals of a musical instrument of a percussion musical instrument group, a ratio of a level of the signal when strongly played to a level of the signal when weakly played will be large, resulting in a wide dynamic range. In contrast to this, with regard to musical sound signals of a musical instrument of a sustained tone group, a ratio of a level of the signal when strongly played to a level of the signal when weakly played will be small, resulting in a narrow dynamic range. Further, an average signal level varies depending on each musical instrument type, so that depending on the musical instrument type, the dynamic range may shift to large level or to small level.

The device of this embodiment is a digital mixer and expresses signals in digital data. When an audio signal is expressed as 16-bit data, for example, the lower limit of the signal level (the level minimum value) is −96 dBFS and the upper limit of the signal level (the level maximum value) is 0 dBFS. Further, when an audio signal is expressed as 24-bit data, the level minimum value is −144 dBFS and the level maximum value is 0 dBFS. Within the range of the level minimum value to the level maximum value, a dynamic range of a musical sound signal of the musical instrument type (namely the range of the recommended minimum value 414 to the recommended maximum value 415) is positioned with respect to each musical instrument type (category).

FIG. 5 is a view illustrating an example of a recommended range of a level in each category. 501 denotes the level minimum value that can be expressed by the device of this embodiment, and 502 denotes the level maximum value that can be expressed by the device of this embodiment. The unit of the value is dBFS. Within this range, a dynamic range of a signal of a musical instrument type of each category is positioned. For example, the dynamic range of the category of Vocal is a range denoted by 510, the dynamic range of the category of Synth is a range denoted by 520, and the dynamic range of the category of Kick is a range denoted by 530. 511 and 512 respectively denote the recommended minimum value and the recommended maximum value of the dynamic range of Vocal. 521 and 522 respectively denote the recommended minimum value and the recommended maximum value of the dynamic range of Synth. In the category information of Vocal explained in FIG. 4, in the item of the recommended minimum value 414, the value of the recommended minimum value 511 is set and in the item of the recommended maximum value 415, the value of the recommended maximum value 512 is set. Further, in the category information of Synth, in the item of the recommended minimum value 414, the value of the recommended minimum value 521 is set and in the item of the recommended maximum value 415, the value of the recommended maximum value 522 is set. The same is applied also to the category information of the other categories.

The dynamic ranges 510, 520, 530, . . . of these categories each indicate such dynamic range that if the level of a musical sound signal of a musical instrument type of the category generally fluctuates within the range, the sound signal can be estimated to be proper. Thus, it is possible to say that the level of the musical sound signal is adjusted properly, when a musical sound signal of a musical instrument type of a certain category is inputted and the gain is controlled so that the signal level can fall within the above-described dynamic range of the category by adjusting gain of the HA 211. In the mixer of this embodiment, a category can be set to each of the channels on the channel name setting screen 301, and the recommended minimum value 414 and the recommended maximum value 415 are included in the category information 400. Thus, when gain setting in the HA 211 of each channel is performed, the recommended minimum value 414 and the recommended maximum value 415 of the category information 400 of the category set to the channel are read out to be exhibited to the user.

FIG. 6 illustrates an example of a gain setting screen. When the user specifies a channel for which the user desires to set a gain of the HA 211 and performs a predetermined gain setting instruction operation, the digital mixer 100 displays a screen 601 in FIG. 6. Here, the screen 601 where gain setting of three channels ch1 to ch3 is performed is taken as an example. The left area of the screen 601 is a gain setting screen for ch1, and 611 is an index display indicating that Vocal is set to ch1 as a category. The similar index is displayed also for each of ch2 and ch3.

On the gain setting screen of ch1, 612 denotes a recommended range, 613 denotes a meter display, and 614 denotes a display of a knob (a knob control as a GUI, for example)

to be touched when gain setting is performed. When the user desires to perform gain setting of ch1, for example, the user first touches the knob display 614 to bring ch1 into a selected state and operates a knob (provided on the control panel) being a physical control corresponding to the knob display 614, to thereby perform setting of a gain of the HA 211 of ch1. Alternatively, a gesture input to operate the knob display 614 on the gain setting screen is given to the touch panel, and thereby setting of a gain of the HA 211 of ch1 is performed.

The meter display 613 is a meter to display the level of a signal obtained after level adjustment in the HA 211 of ch1. The lower end 641 of a vertically long rectangle corresponds to the level minimum value 501 in FIG. 5 and the upper end 642 thereof corresponds to the level maximum value 502. An upper end of a portion painted in gray indicates a present level value (to be called a "meter value"). The recommended range 612 is a rectangular display indicating the dynamic range corresponding to the musical instrument type of the category set for ch1. The lower end 651 corresponds to the position of the recommended minimum value 511 in FIG. 5 and the upper end 652 corresponds to the position of the recommended maximum value 512 in FIG. 5. Since the category of this channel is Vocal, the digital mixer 100 reads out the recommended minimum value 414 and the recommended maximum value 415 of the category information 400 of Vocal, and based on a scale from the minimum value 641 to the maximum value 642 of the meter display 613, determines the position of the lower end 651 and the position of the upper end 652 according to the values of the recommended minimum value 414 and the recommended maximum value 415, displays the rectangle of the recommended range 612. In the same manner, at ch2, a recommended range 622 representing the range of the dynamic range 520 of the category of Synth is displayed, and at ch3, a recommended range 632 representing the range of the dynamic range 530 of the category of Kick is displayed. As above, the mixer 100 meter-displays the level of a level-adjusted signal based on the recommended range of the level in the category set for each of the channels.

When the user performs gain setting of the HA 211 of, for example, ch1, while confirming the level of an inputted signal on the meter display 613, the user only needs to perform an adjustment operation of the knob so that a fluctuation amplitude of the meter value of the signal can regularly fall within the recommended range 612. The same is applied also to the other channels. Display of each channel is provided with the recommended range corresponding to the category set for the channel, so that even a beginner who does not know how to perform gain setting can perform proper gain setting easily.

FIG. 7 is a graph illustrating a display image of the meter (for example, 641) on the gain setting screen. The horizontal axis indicates time and the vertical axis indicates a signal level. In this embodiment, the user can select a mode in which a level value of an actual input signal itself is displayed as a meter value, which is called decay mode off, or a mode in which a level value of an actual input signal is decayed to be displayed as a meter value, which is called decay mode on. An operation for the above selection is arbitrary.

A dotted line 701 is a graph illustrating a change in the level value of the actual input signal. In the case of decay mode off, the level value of the dotted line 701 itself is displayed as a meter value. In this case, when displaying levels of musical sounds of a hit sound group whose level value rises suddenly and drops suddenly, the meter value also fluctuates suddenly with the change. Thus, the user sometimes has difficulty in viewing a fluctuation amplitude of the meter value. In such a case, decay mode on is to be applied. A solid line 702 is a graph illustrating a change in the meter value in the case of decay mode on. In this case, when the level value of the input signal changes as indicated by the dotted line 701, at positions of, for example, 711 and 712 where the level value changes suddenly, change rate of decay is decreased, and thus the meter value indicated by the solid line 702, which changes gradually, is displayed. This makes it easier to view the fluctuation amplitude of the input signal, and gain setting can be performed easily. Incidentally, how much the change rate of decay is decreased, in other words, how much the meter value is made gradual can be set with the above-described decay value 416 in the category information 400.

FIG. 8 and FIG. 9 illustrate a different example of the meter display. This example is an example where only the recommended range of the level of each category is scaled to be meter-displayed. The rectangles of Vocal, Synth, and Kick in FIG. 8 indicate the recommended ranges of the individual categories, and are the same ones as those in FIG. 5. The same numbers are added to the same ones in FIG. 5 and in FIG. 8. In the example in FIG. 8, it is designed that dynamic ranges 510, 520, 530, . . . being the recommended ranges of the individual categories are scaled (mapped) and when each signal level falls within these ranges, the meter display is performed. In this example, each of the dynamic ranges is scaled to a predetermined number of segments and a light/lights of the segment/segments according to the signal level is/are turned on. The segment is a single small rectangular area capable of lighting display (one simulated a lighting LED) and light-out display (one simulated an unlighted LED). In the category of Vocal, the dynamic range 510 is equally divided into five divided sections and the individual divided sections are made to correspond to five segments 801 in order. In the same manner, also in the category of Synth and the category of Kick, the dynamic range 520 and the range of the dynamic range 530 are each equally divided into five divided sections, and the individual divided sections are made to correspond to five segments in order.

FIG. 9 illustrates an example of the gain setting screen of the case when scaling is performed as illustrated in FIG. 8. In the same manner as in FIG. 6, a screen 901 is displayed according to a predetermined operation of the user. Here, the screen for the single channel ch1 is illustrated. In the same manner as in FIG. 6, screens for a plurality of channels may also be displayed. 903 is the same display as the index display 611 in FIG. 6. 905 is a display of a knob, which is the same as the knob display 614 in FIG. 6, to be touched to select a channel whose gain setting is performed.

904 includes five segments 904-1 to 904-5 corresponding to 801 in FIG. 8. As illustrated in FIG. 8, the dynamic range 510 is equally divided into five sections, and the individual divided sections correspond to the five segments 904-1 to 904-5 in order respectively. When the signal level obtained after level adjustment in the HA 211 is in the head divided section 510-1 of the dynamic range 510, for example, a light of the corresponding segment 904-1 is turned on and lights of the other segments are turned off. Similarly, when the signal level obtained after level adjustment in the HA 211 is in the second divided section 510-2, a light of the corresponding segment 904-2 is turned on and lights of the other segments are turned off. When the signal level obtained after level adjustment in the HA 211 is not in the dynamic range 510, lights of all the five segments 904 are turned off.

As above, in the example in FIG. 9 as well, the mixer 100 meter-displays the level of a level-adjusted signal based on the recommended range of the level in the category set for each of the channels.

The user only needs to perform an adjustment operation of the knob so as to keep a light of any one of the five segments regularly on (namely so as to prevent lights of all the five segments from being turned off) while viewing the meter display 904. By such a scaled meter display, even a beginner can perform proper gain setting easily. Further, when the displays such as the recommended ranges 612, 622 and 632 in FIG. 6 are applied, gain adjustment needs to be performed so that the signal level can fall within the recommended range with a variety of width depending on categories, so that there is sometimes a case that the adjustment operation is not performed easily. However, as has been explained in FIG. 8 and FIG. 9, in all the categories, the recommended ranges are scaled into the same number of segments, and thereby there is an advantage that the user can perform gain adjustment in any category in the same sense. Incidentally, in the examples in FIG. 8 and FIG. 9, it is also possible that the level value of an input signal is decayed to be meter-displayed as has been explained in FIG. 7.

FIG. 10 is a flowchart of a gain setting process executed by the CPU 101. This processing is started in response to a user's predetermined operation to give an instruction of gain setting. It is assumed that a channel to be subjected to the gain setting process and a category set for the channel are already specified when this processing is started. First, at step 1001, the CPU 101 obtains the category information 400 of the category set for the channel being a processing target, and at step 1002, obtains the recommended minimum value 414 and the recommended maximum value 415 from the category information 400.

At step 1003, the CPU 101 determines whether to apply the screen illustrated in FIG. 9 where scaling is performed or the screen illustrated in FIG. 6 where scaling is not performed. It is assumed that which screen to apply is specified by the user beforehand. In the case when scaling is not performed, at step 1004, the CPU displays the gain setting screen such as FIG. 6 (including objects other than the recommended ranges and the meter displays). Next, at step 1005, the CPU 101 displays the recommended range (612 in FIG. 6 or the like) according to the recommended minimum value 414 and the recommended maximum value 415 obtained at step 1002. At step 1006, the CPU 101 sets the meter area (613 in FIG. 6 or the like). When scaling is performed at step 1003, at step 1007, the CPU 101 displays the gain setting screen such as FIG. 9 (including objects other than the meter display). At step 1008, the CPU 101 scales set the meter area (904 in FIG. 9) scaled according to the recommended minimum value 414 and the recommended maximum value 415 obtained at step 1002.

Next, at step 1009, the CPU 101 determines whether or not to make decay reflected on the meter display. It is assumed that whether or not to decay a meter value is specified by the user beforehand. When the meter value is not to be decayed, the CPU 101 applies the decay mode off at step 1010, and when a meter value is to be decayed, the CPU 101 applies the decay mode on at step 1011.

Steps 1012 to 1015 are loop processing for repeatedly performing the meter display on the gain setting screen. When an instruction to close the gain setting screen is given, this loop processing ends. Incidentally, when this meter display is performed repeatedly, in another routine in parallel, a process of detecting an operation to a knob to perform gain setting of a channel being a processing target and supplying a gain value according to the detected operation to the HA 211 is executed repeatedly.

During the loop processing at steps 1012 to 1015, at step 1013, a the CPU 101 obtains level value of a metering point of the channel being a processing target. Level value of the signal after level adjustment in the HA 211 is obtained here. At step 1014, the CPU 101 updates the meter display according to the level value. Incidentally, in the case of decay mode on, the CPU 101 decays the meter value according to the decay value 416 in the category information 400 obtained at step 1001.

In the above-described embodiment, as illustrated in FIG. 6, the meter display and the recommended range are displayed in rectangles different from each other, but it is also possible that the recommended range is displayed on the meter display itself with a different display color.

In FIG. 6 in the above-described embodiment, the meter display and the recommended range are each displayed with a rectangle long in the vertical direction, but they may also be positioned in the lateral direction. In FIG. 9, the meter display is expressed by the five segments aligned in the lateral direction, but the number of segments is not limited to this, and further the alignment direction may also be the vertical direction.

In the above-described embodiment, the decay value 416 is provided in each category, but a single decay value common to all the categories may also be used. The gain information 411 in the category information 400 may be factory preset beforehand, or may also be changed by the user.

Incidentally, whether or not to perform scaling may be fixedly determined beforehand. In this case, the processing at step 1003 may be omitted and either the process of step 1004 to step 1006 or the process of step 1007 and step 1008 should be executed. Further, whether or not the decay is to be effective may also be fixedly determined beforehand. In this case, the process of steps 1009, 1010, and 1011 may be omitted and at step 1014, the display of the meter area may be updated in the decay mode determined beforehand.

This embodiment is one in which the present invention is applied to the digital mixer 100, but the embodiment of the present invention is not limited to this and is applicable to various embodiments without departing from the technical idea of the present invention. For example, it is possible that software realizing the present invention is installed in a general-purpose information terminal (a PC, a smartphone, or the like) and the software is executed, to thereby enable the information terminal to function as the signal processing device of the present invention. Alternatively, it is also possible that software realizing the present invention is provided as an online service and a general-purpose information terminal accesses the service, to thereby function as the signal processing device of the present invention as a whole.

REFERENCE SIGNS LIST

100 . . . digital mixer, 101 . . . central processing unit (CPU), 102 . . . memory, 103 . . . display, 104 . . . controls, 105 . . . signal processing unit (DSP), 106 . . . waveform I/O, 107 . . . other I/O

The invention claimed is:
1. An audio signal processing device, comprising:
a range information storing portion configured to store range information indicating a signal-level range with respect to a sound volume level of an audio signal for each category representing a signal type for the audio signal, wherein the signal-level range is a recommended signal-level range of a sound volume level of an audio signal for the signal type represented by the respective category;
a gain setting portion configured to set a gain used for adjusting a sound volume level of an input audio signal according to an operation by a user;
a category setting portion configured to set the category representing the signal type for the input audio signal;
a meter portion configured to display a first display to display a sound volume level of the input audio signal after a level adjustment according to the gain, the first display indicating a level minimum value and a level maximum value for the displayed sound volume level; and
a portion configured to display a second display to exhibit the recommended signal-level range of a sound volume level of an audio signal for the signal type represented by the category set by the category setting portion in a manner to correspond to the first display of the sound volume level by the meter portion, the second display indicating a range minimum value and a range maximum value for the exhibited recommended signal-level range of a sound volume level of an audio signal.

2. An audio signal processing device, comprising:
a range information storing portion configured to store a minimum value and a maximum value, the minimum value and the maximum value indicating a signal-level range with respect to a sound volume level of an audio signal for each category representing a signal type for the audio signal, wherein the signal-level range is a recommended signal-level range of a sound volume level of an audio signal for the signal type represented by the respective category;
a gain setting portion configured to set a gain used for adjusting a sound volume level of an input audio signal according to an operation by a user;
a category setting portion configured to set the category representing the signal type for the input audio signal; and
a portion configured to display a display to display a sound volume level of the input audio signal after a level adjustment according to the gain such that a lower limit of the display of the sound volume level corresponds to the minimum value of the recommended signal-level range of a sound volume level of an audio signal for the signal type represented by the category set by the category setting portion, and an upper limit of the display of the sound volume level corresponds to the maximum value of the recommended signal-level range of a sound volume level of an audio signal for the signal type represented by the category set by the category setting portion.

3. The audio signal processing device according to claim 1, wherein
the meter portion receives the input audio signal after the level adjustment, decreases a change rate of decay for the received signal to generate a meter value which changes gradually, and displays the meter value as the sound volume level of the input audio signal in the first display.

4. The audio signal processing device according to claim 2, wherein
the portion configured to display the display receives the input audio signal after the level adjustment, decreases a change rate of decay for the received audio signal to generate a meter value which changes gradually, and displays the meter value as the sound volume level of the input audio signal in the display.

5. A non-transitory machine-readable storage medium containing program instructions executable by a computer and enabling the computer to function as an audio signal processing device comprising:
a range information storing portion configured to store range information indicating a signal-level range with respect to a sound volume level of an audio signal for each category representing a signal type for the audio signal, wherein the signal-level range is a recommended signal-level range of a sound volume level of an audio signal for the signal type represented by the respective category;
a gain setting portion configured to set a gain used for adjusting a sound volume level of an input audio signal according to an operation by a user;
a category setting portion configured to set the category representing the signal type for the input audio signal;
a meter portion configured to display a first display to display a sound volume level of the input audio signal after a level adjustment according to the gain, the first display indicating a level minimum value and a level maximum value for the displayed sound volume level; and
a portion configured to display a second display to exhibit the recommended signal-level range of a sound volume level of an audio signal for the signal type represented by the category set by the category setting portion in a manner to correspond to the first display of the sound volume level by the meter portion, the second display indicating a range minimum value and a range maximum value for the exhibited recommended signal-level range of a sound volume level of an audio signal.

6. A non-transitory machine-readable storage medium containing program instructions executable by a computer and enabling the computer to function as an audio signal processing device comprising:
a range information storing portion configured to store a minimum value and a maximum value, the minimum value and the maximum value indicating a signal-level range with respect to a sound volume level of an audio signal for each category representing a signal type for the audio signal, wherein the signal-level range is a recommended signal-level range of a sound volume level of an audio signal for the signal type represented by the respective category;
a gain setting portion configured to set a gain used for adjusting a sound volume level of an input audio signal according to an operation by a user;
a category setting portion configured to set the category representing the signal type for the input audio signal;
a portion configured to display a display to display a sound volume level of the input audio signal after a level adjustment according to the gain such that a lower limit of the display of the sound volume level corresponds to the minimum value of the recommended signal-level range of a sound volume level of an audio signal for the signal type represented by the category set by the category setting portion, and an upper limit of the display of the sound volume level corresponds to the maximum value of the recommended signal-level range of a sound volume level of an audio signal for the signal type represented by the category set by the category setting portion.

7. The audio signal processing device according to claim 1, wherein each category represents a signal type indicating a type of musical instrument, and wherein the second display is to exhibit the recommended signal-level range according to the type of musical instrument indicated by the signal type represented by the category set by the category setting portion.

8. The audio signal processing device according to claim 2, wherein each category represents a signal type indicating a type of musical instrument, and wherein the minimum value and the maximum value of the recommended signal-level range are according to the type of musical instrument indicated by the signal type represented by the category set by the category setting portion.

9. The non-transitory machine-readable storage medium according to claim 5, wherein each category represents a signal type indicating a type of musical instrument, and wherein the second display is to exhibit the recommended signal-level range according to the type of musical instrument indicated by the signal type represented by the category set by the category setting portion.

10. The non-transitory machine-readable storage medium according to claim 6, wherein each category represents a signal type indicating a type of musical instrument, and wherein the minimum value and the maximum value of the recommended signal-level range are according to the type of musical instrument indicated by the signal type represented by the category set by the category setting portion.

* * * * *